(12) United States Patent
Marakhtanov et al.

(10) Patent No.: US 8,154,209 B2
(45) Date of Patent: Apr. 10, 2012

(54) MODULATED MULTI-FREQUENCY PROCESSING METHOD

(75) Inventors: Alexei Marakhtanov, Albany, CA (US); Eric Hudson, Berkeley, CA (US); Rajhinder Dhindsa, San Jose, CA (US); Andrew Bailey, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 266 days.

(21) Appl. No.: 12/621,590

(22) Filed: Nov. 19, 2009

(65) Prior Publication Data

US 2010/0253224 A1  Oct. 7, 2010

Related U.S. Application Data

(60) Provisional application No. 61/166,987, filed on Apr. 6, 2009.

(51) Int. Cl.
  *H05B 31/26* (2006.01)
(52) U.S. Cl. ......... 315/111.21; 315/111.41; 315/111.71
(58) Field of Classification Search ............ 315/111.21, 315/111.41, 111.51, 111.71, 111.81, 111.91; 156/345.43, 345.44, 345.45, 345.46, 345.47; 118/723 E
See application file for complete search history.

(56) References Cited

U.S. PATENT DOCUMENTS

| | | | | |
|---|---|---|---|---|
| 6,380,684 B1 * | 4/2002 | Li et al. | | 315/111.21 |
| 6,538,388 B2 * | 3/2003 | Nakano et al. | | 315/111.21 |
| 6,885,153 B2 * | 4/2005 | Quon | | 315/111.31 |
| 6,885,154 B2 * | 4/2005 | Uchida et al. | | 315/111.71 |
| 6,972,524 B1 * | 12/2005 | Marakhtanov et al. | .. | 315/111.21 |
| 7,183,716 B2 * | 2/2007 | Kanarov et al. | | 315/111.51 |
| 7,494,561 B2 * | 2/2009 | Koshiishi et al. | | 156/345.47 |
| 7,837,826 B2 * | 11/2010 | Marakhtanov et al. | .. | 156/345.48 |
| 2003/0015965 A1 * | 1/2003 | Godyak | | 315/111.21 |
| 2007/0247073 A1 * | 10/2007 | Paterson et al. | | 315/111.21 |

* cited by examiner

Primary Examiner — Douglas W Owens
Assistant Examiner — Tung X Le

(57) ABSTRACT

A method is provided for operating a processing system having a space therein arranged to receive a gas and an electromagnetic field generating portion operable to generate an electromagnetic field within the space. The method includes providing a gas into the space, and operating the electromagnetic field generating portion with a driving potential to generate an electromagnetic field within the space to transform at least a portion of the gas into plasma. The driving potential as a function of time is based on a first potential function portion and a second potential function portion. The first potential function portion comprises a first continuous periodic portion having a first amplitude and a first frequency. The second potential function portion comprises a second periodic portion having an maximum amplitude portion, and minimum amplitude portion and a duty cycle. The maximum amplitude portion is a higher amplitude than the minimum amplitude portion. The duty cycle is the ratio of a duration of the maximum amplitude portion to the sum of the duration of the maximum amplitude portion and the duration of the minimum amplitude portion. The second periodic portion additionally has a second frequency during the maximum amplitude portion. An amplitude modulation of the second periodic portion is phase locked to the first continuous periodic portion.

20 Claims, 4 Drawing Sheets

MODULATED MULTI-FREQUENCY PROCESSING METHOD

The present application claims priority from U.S. Provisional Application No. 61/166,987 filed Apr. 6, 2009, the entire disclosure of which is incorporated herein by reference.

BACKGROUND

In the semiconductor manufacturing industry, plasma etching is widely used in wafer processing. It is typically used to create features such as contact holes or trenches in materials in order to form electrical contacts. Given that space is an important consideration in manufacturing, it is often desirable to make these contact holes as narrow and as deep as possible. The etching of such narrow and deep features poses many challenges due to various complications and difficulties that arise during the plasma etching process.

FIG. 1 illustrates a cross-sectional view of a left side of a conventional wafer processing system during a conventional plasma etching process. Wafer processing system 100 includes a processing chamber 102, an upper electrode 104; an electro-static chuck (ESC) 106 and an RF driver 110. Processing chamber 102, upper electrode 104 and ESC 106 are arranged to provide a plasma-forming space 108. RF driver 110 is electrically connected to ESC 106, while upper electrode 104 is electrically connected to ground.

In operation, a wafer 114 is held on ESC 106 via an electrostatic force. A gas source (not shown) supplies an etching gas to plasma-forming space 108. RF driver 110 provides a driving signal to ESC 106, thus providing a voltage differential between ESC 106 and upper electrode 104. The voltage differential creates an electromagnetic field in plasma-forming space 108, wherein the gas in plasma-forming space 108 is ionized, forming plasma 112. Plasma 112 etches the surface of wafer 114.

An example conventional process of etching a wafer will now be discussed below with reference to FIG. 2A and FIG. 2B.

FIG. 2A illustrates a cross-section of wafer 114 as shown in FIG. 1, before plasma 112 is formed and thus before any material on wafer 114 is etched. In FIG. 2A, wafer 114 includes a substrate 200 and a mask 202. Mask 202 serves to define the areas of substrate 200 that are to be etched by plasma 112. The portion of substrate 200 that is not covered by mask 202 (unmasked area 204) is exposed to plasma 112 and therefore will be etched away during the etching process. Conversely, the portions of substrate 200 that are covered by mask 202 (masked areas 206) are not subjected to plasma 112, and therefore will not be etched away during the etching process. Mask 202 itself, being exposed to plasma 112, is also etched somewhat; however, the properties of plasma 112 are typically chosen such that the etch rate of mask 202 is much slower than that of substrate 200 (giving it high selectivity), thereby leaving mask 202 mostly intact.

FIG. 2B illustrates a cross-section of wafer 114, after plasma 112 has been formed and the etching process has begun. During the etching process, the surface of wafer 114 is bombarded by incident plasma ions 208 from plasma 112. In unmasked area 204, incident plasma ions 208 etch away a portion of substrate 200, forming an etched hole 212. During the etching process, the incident flux of polymerizing neutral species from plasma along with incident plasma ions 208 causes a polymer layer 210 to be deposited on the exposed wafer surface (mostly on top surface of mask 202). The buildup of polymer layer 210 generally serves to prevent the undesired etching of mask 202, thereby making the etch process more selective towards the material of substrate 200. Alternatively, the incident neutral and ion species can act to reduce the etch rate of mask 202, thereby making the etch process more selective towards the material of substrate 200.

As shown in FIG. 2B, etched contact hole 212 has hole height 214 (noted as $h_1$) and hole diameter 216 (noted as $d_1$). An aspect ratio is defined as the height divided by the diameter. In this case, the aspect ratio of etched hole 212 is defined as $h_1/d_1$. Conventionally, contact holes with a relatively low aspect ratio like etched hole 212 can be etched relatively easily with minimal distortion of the hole, as will described in further detail later. However, in several semiconductor applications, there is a high demand to provide high aspect ratio etching, such as to form high aspect ratio contacts (HARC), which involves the etching of very deep holes with small diameters. There are several challenges in the conventional method for providing a HARC etch process, as will now be described with reference to FIGS. 3A-5B.

FIGS. 3A and 3B are graphs representing signals provided by RF driver 110 as a function of time. FIGS. 3C and 3D are each graphs representing ion flux as a function of ion energy, of the signals illustrated in FIGS. 3A and 3B, respectively.

FIG. 3A includes function 300, which is a low-frequency driving signal. FIG. 3B includes function 302, which is a driving signal comprised of a low-frequency portion and a high-frequency portion. FIG. 3C includes function 304, which is the measured ion flux as a function of ion energy that results from using function 300 in FIG. 3A as the driving signal provided by RF driver 110. FIG. 3D includes function 308, which illustrates the predicted ion energy distribution that would result from implementing function 302 of FIG. 3B as the driving signal provided by RF driver 110.

As shown in FIG. 3C, function 304 exhibits a first peak 306 for lower ion energies and a second peak 308 for higher ion energies. As illustrated in the figure, first peak 306 is much larger than second peak 308. Accordingly, lower ion energies as represented by larger first peak 306 will have an effect on process results. For some process requirements, it is considered beneficial to provide a higher flux of low energy ions. In other words, it is beneficial for peak 306 to be as large as possible and at the lowest energy possible. Low energy ions are considered beneficial for two reasons. First, they may reduce feature charging during an etching process by discharging sidewalls. Specifically, because the positive ions have low energy, they are attracted to negatively-charged regions on the feature surface, thereby reducing the feature charging. Second, low energy ions may contribute to polymer deposition during an etching process to protect a mask.

Function 304 is shown in FIG. 3D as a dotted line for reference. As shown in FIG. 3D, function 310 contains a first peak 312, which is shifted to a higher ion energy from peak 306 of function 304. Further, function 310 contains a second peak 314, which is shifted to a lower ion energy from peak 308 of function 304. Similarly, as discussed with reference to FIG. 3C, lower ion energies as represented by first peak 312 will have a significant effect on process results.

The addition of a high-frequency portion in the driving signal as illustrated in FIG. 3B provides an increase in plasma density. As such, the amount of ion flux corresponding to ion energy of first peak 312 of FIG. 3D is greater than the amount of ion flux corresponding to ion energy of first peak 306 of FIG. 3C. Therefore, it is clear that the introduction of a high-frequency portion in the driving signal (switching from function 300 to 302) shifts the ion energy distribution and provides an overall increase in plasma density and ion flux.

FIG. 4 is a graph illustrating the plasma sheath potential at wafer 114 in a conventional method for providing a HARC etch in which function 302 of FIG. 3B is implemented as the driving signal supplied by RF driver 110. In the graph, the x-axis is time, in seconds, whereas the y-axis is the plasma sheath potential, in volts, at the wafer. The plasma sheath potential as a function of time (function 400) is related to the signal provided by RF driver 110. In this example, the signal provided by RF driver 110 includes a superposition of a continuous low frequency portion and a continuous high frequency portion, as shown in FIG. 3B. Therefore, as shown in FIG. 4, the resulting plasma sheath potential (function 400) also includes a superposition of a continuous low frequency portion and a continuous high frequency portion, with some distortion as typically observed for RF plasma sheaths.

Conventional HARC etching processes may use a combination of continuous high frequency and continuous low frequency signals as applied by RF driver 110. Continuous high frequency signals are used to produce high plasma density and, therefore, high ion flux. Continuous low frequency signals are used to produce high plasma sheath potential and, therefore, high ion bombardment energies, as part of a wide distribution of ion energies.

In conventional HARC etching processes. RF driver 110 may provide a driving signal to ESC 110 that includes a superposition of a continuous high frequency portion at a first power and a continuous low frequency portion at a second power (such as function 302 in FIG. 3B). By adjusting the ratio between the power of the continuous high frequency portion and the power of the continuous low frequency portion, one can adjust various plasma properties and can thus adjust the etching characteristics of the plasma. For example, if the power of the continuous high frequency portion of the driving signal is relatively large and the power of the continuous low frequency portion of the driving signal is relatively small, the resulting plasma will be characterized by higher plasma density and ion flux, in combination with lower maximum ion energy. Also, increasing the power of the continuous high frequency portion of the driving signal may increase the polymerization process, thereby resulting in higher contact-to-mask etch selectivity, but can also lead to the etch stop. Additionally, a relatively large power of the continuous high frequency portion of the driving signal will typically increase distortion of the etched hole, as will be discussed below with reference to FIG. 5A.

FIG. 5A illustrates a cross-section of wafer 114 that may result from a conventional HARC etching process. In this example, a driving signal from RF driver 110 includes a continuous high frequency portion and a continuous low frequency portion, wherein the power of the continuous high frequency portion of the driving signal is relatively large and the power of the continuous low frequency portion of the driving signal is relatively small. In this example, the driving signal produces a plasma having a plasma sheath potential described by function 300.

In this example, during the etching process, incident plasma ions 208 in the presence of incident flux of neutral species from plasma 112 bombard the surface of wafer 114. This causes polymer layer 210 to be deposited onto some of the exposed wafer surfaces. At the same time, the bombardment of incident plasma ions 208 causes a portion of substrate 202 in unmasked area 204 to be etched away, forming etched contact hole 500. Etched hole 500 has hole height 502 (denoted as $h_2$) and hole diameter 504 (denoted as $d_2$). Therefore etched hole 500 has an aspect ratio of $h_2/d_2$. Here, $h_2 \gg h_1$. Consequently, the aspect ratio of etched hole 500 is notably higher than the aspect ratio of etched hole 212 of FIG. 2B.

However, as shown in FIG. 5A, the walls of etched hole 500 are not completely vertical and the bottom is twisted to one side. Although exact mechanisms are not fully understood, this twisting effect may be explained by accumulated charge on the walls of etched hole 500. FIG. 5B shows a magnified view of the bottom region of etched hole 500, illustrating this accumulated charge in polymer layer 210. The presence of a positive differential charge 506 and a negative differential charge 508 gives rise to an electric field which serves to deflect the downward-directed incident plasma ions 208 towards one side. Since the ion trajectory 510 is now curved towards the right, the etching occurs preferentially towards the right surface instead of at the bottom surface of etched hole 500. This effect therefore causes etched hole 500 to be distorted, or twisted.

In the conventional HARC etch process, the distortion of etched contact holes can be minimized by reducing the power of the continuous high frequency portion of the signal provided by RF driver 110. However, this method decreases the polymerizing properties of the process and therefore decreases contact-to-mask etch selectivity. Also, this method decreases the plasma density and ion flux, thereby slowing down the etch rate.

What is needed is a system and method to provide for the best HARC etch process results with no distortion while at the same time maintaining a high contact-to-mask selectivity and high etch rate for higher throughput.

BRIEF SUMMARY

It is an object of the present invention to provide a system and method that yields superior HARC etch process results with no distortion while at the same time maintaining a high contact-to-mask selectivity and high etch rate for higher throughput.

In accordance with an aspect of the present invention, a method is provided of operating a processing system having a space for receiving gas, an electrode portion and an RF driver. The RF driver can provide a driving signal to the electrode portion. The method includes providing a gas into the space, providing the driving signal to the electrode portion, wherein the driving signal is based on a first signal portion and a second signal portion, and generating, from the gas, a plasma in the space. The plasma has a plasma sheath, which has a plasma sheath potential, which is based on the driving signal. The plasma sheath potential as a function of time is a superposition of a first, plasma sheath potential function portion and a second plasma sheath potential function portion. The first plasma sheath potential function portion comprises a continuous portion having a first amplitude and a first frequency. The second plasma sheath potential function portion comprises a periodic portion having a first portion, and a second portion and a duty cycle. The first portion has a second frequency, a first duration and a first portion amplitude. The second portion has a second duration and a second portion amplitude. The first portion amplitude is larger than the second portion amplitude. The duty cycle is the ratio of the first duration to the sum of the first duration and the second duration. An amplitude modulation of the second plasma sheath potential function portion is amplitude-modulated at a frequency equal to a harmonic of the first plasma sheath potential function portion.

In accordance with an aspect of the present invention, a method is provided of operating a processing system having a space therein arranged to receive a gas and an electromagnetic field generating portion operable to generate an electromagnetic field within the space. The method includes providing a gas into the space, and operating the electromagnetic field generating portion with a driving potential to generate an electromagnetic field within the space to transform at least a portion of the gas into plasma. The driving potential as a function of time is based on a first potential function portion and a second potential function portion. The first potential function portion comprises a first continuous sinusoidal portion having a first amplitude and a first frequency. The second potential function portion comprises a second sinusoidal portion having a maximum amplitude interval a minimum amplitude interval and a duty cycle. During the maximum amplitude interval, the second sinusoidal portion has a higher amplitude than during the minimum amplitude interval. The duty cycle is the ratio of a duration of the maximum amplitude interval to the sum of the duration of the maximum amplitude interval and the duration of the minimum amplitude interval. The second sinusoidal portion additionally has a second frequency The second sinusoidal portion is amplitude-modulated at a frequency equal to the first frequency of the first continuous sinusoidal portion The relative phase between the amplitude modulation and the first continuous sinusoidal portion is controlled and variable.

Additional objects, advantages and novel features of the invention are set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF SUMMARY OF THE DRAWINGS

The accompanying drawings, which are incorporated in and form a part of the specification, illustrate an exemplary embodiment of the present invention and, together with the description, serve to explain the principles of the invention. In the drawings.

DETAILED DESCRIPTION

Figure 1:
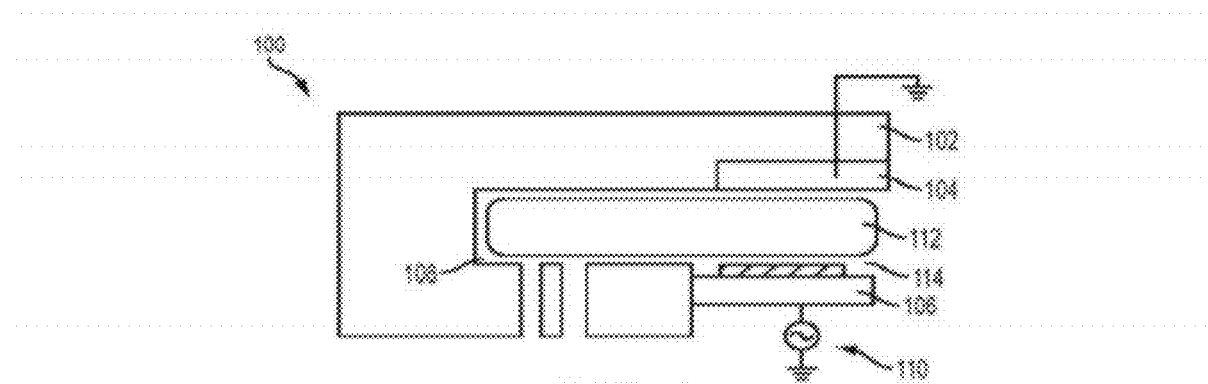
FIG. 1 illustrates a cross-sectional view of a left side of a conventional wafer processing system during a conventional plasma etching process.

In accordance with an aspect of the present invention, a system and method provides for best HARC etch with no contact hole distortion, while maintaining a high etch rate for high throughput. More particularly, in accordance with an aspect of the present invention, a processing system that is operable to generate a plasma by way affecting a gas with an electromagnetic field, is operated in a particular manner to control a parameter as a function of time that is based on a low frequency sinusoidal portion and a high frequency sinusoidal portion. The high frequency sinusoidal portion is amplitude-modulated at a frequency equal to a harmonic of the low frequency sinusoidal portion. Further, the high frequency sinusoidal portion includes a high amplitude interval and a low amplitude interval. The duration of the duty cycle of the high frequency sinusoidal portion is the ratio of the duration of the high amplitude interval to the sum of the duration of the high amplitude interval and the duration of the low amplitude interval. By adjusting any one of: the amplitude of the high amplitude interval of the high frequency sinusoidal portion; the amplitude of the low amplitude interval of the high frequency sinusoidal portion; the duration of the duty cycle of the high frequency sinusoidal portion; and the relative phase between the high frequency sinusoidal portion and the low frequency sinusoidal portion, processing characteristics of the processing system may be accurately controlled.

In example embodiments, the parameter as a function of time is a plasma sheath potential that is based on a low frequency sinusoidal portion and a high frequency sinusoidal portion. In these example embodiments, the high-frequency sinusoidal portion of the plasma sheath potential as a function of time has a maximum amplitude interval, a minimum amplitude interval and a duty cycle, wherein the plasma sheath potential as a function of time has a higher amplitude during the maximum amplitude interval than during the minimum amplitude interval and wherein the duty cycle is the ratio of the maximum amplitude interval to the sum of the maximum amplitude interval and the minimum amplitude interval. Further, in some example embodiments, the high-frequency sinusoidal portion of the plasma sheath potential as a function of time is amplitude-modulated at a frequency equal to a harmonic of the low frequency sinusoidal portion such that the maximum amplitude interval of the high-frequency sinusoidal portion occurs at or near the maximum amplitude of a cycle of the low frequency sinusoidal portion and such that the minimum amplitude interval of the high frequency sinusoidal portion occurs at or near the minimum amplitude of a cycle of the low frequency sinusoidal portion.

In other example embodiments, the parameter as a function of time is a driving signal that is based on a low frequency sinusoidal portion and a high frequency sinusoidal portion. In these example embodiments, the driving signal may be described in terms of a low frequency sinusoidal portion and a high frequency sinusoidal portion that is amplitude-modulated at a frequency equal to a harmonic of the low frequency sinusoidal portion such that a maximum amplitude interval of the high-frequency sinusoidal portion occurs at or near a minimum amplitude of a cycle of the low frequency sinusoidal portion and such that a minimum amplitude interval of the high frequency sinusoidal portion occurs at or near a maximum amplitude of a cycle of the low frequency sinusoidal portion.

An example embodiment in accordance with an aspect of the present invention will now be described with reference to FIG. 6-8.

Figure 6:
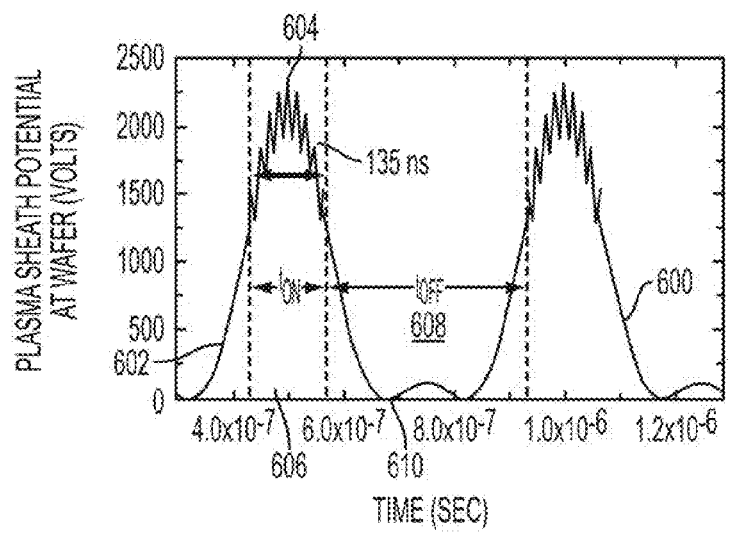
FIG. 6 is a graph illustrating the plasma sheath potential at a wafer in an example method for providing a HARC etch in accordance with an aspect of the present invention.

FIG. 6 is a graph illustrating the plasma sheath potential at wafer 114 in an example method for providing a HARC etch in accordance with an aspect of the present invention. In the graph, the x-axis is time, whereas the y-axis is the plasma sheath potential, in volts, at the wafer surface. The plasma sheath potential as a function of time (function 600) is related to the signal provided by RF driver 110. In this example, the signal provided by RF driver 110 is provided such that the resulting plasma sheath potential (function 600) is based on a continuous low frequency portion 602 and a high frequency portion 604. In example embodiments, continuous low frequency portion 602 is amplitude-modulated at a frequency equal to a harmonic of high frequency portion 604.

Continuous low frequency portion 602 has a frequency and an amplitude. High frequency portion 604 includes a minimum amplitude interval and a maximum amplitude interval. In this example the minimum amplitude interval of high frequency portion 604 has zero amplitude, wherein high frequency portion 604 seems to be "OFF." In this example, the maximum amplitude interval of high frequency portion 604 has an amplitude that is smaller than the amplitude of continuous low frequency portion 602. At the maximum amplitude interval, high frequency portion 604 seems to be "ON". As such, the duty cycle of high frequency portion 604 is the ratio of the maximum amplitude interval to the sum of the maximum amplitude interval and the minimum amplitude interval.

As shown in the figure, high frequency portion 604 is only "ON" during specific periods of time. In this example, for every cycle of low frequency portion 602, there is an ON period 606, and an OFF period 608. The length of the ON period is denoted by $t_{ON}$ and the length of the OFF period is denoted by $t_{OFF}$. Therefore the total length of the cycle, or period, of low frequency portion 602 can be denoted as $T_{LF}=t_{ON}+t_{OFF}$. The ratio of time that high frequency portion 604 is in the ON state to the time of the total length of the cycle is referred to as the duty cycle. Thus, duty cycle D would be defined as $t_{ON}/T_{LF}$, or $t_{ON}/(t_{ON}+t_{OFF})$.

The plasma sheath corresponding to low frequency portion 602 has a high plasma sheath potential and provides high bombardment energies. Thus, as shown in FIG. 6, low frequency portion 602 has very large amplitude, much larger than that of high frequency portion 604. The signal provided by RF driver 110 that corresponds to low frequency portion 602 is chosen such that for a given electrode gap, i.e., the distance between upper electrode 104 and ESC 106 of FIG. 1, and for a given gas pressure, the plasma is sustained by among other factors, secondary electron emission. Secondary electron emission is a phenomenon where additional electrons (called secondary electrons) are emitted from the surface of a material when an incident particle (such as an ion) impacts the material with sufficient energy. Once emitted, these secondary electrons are then accelerated back into the plasma and serve to ionize molecules in the plasma.

Figure 5A:
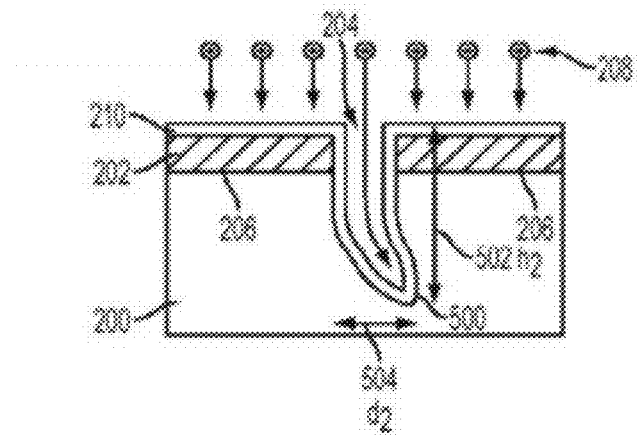
FIG. 5A illustrates a cross-section of a wafer that may result from a conventional HARC etching process.
Figure 5B:
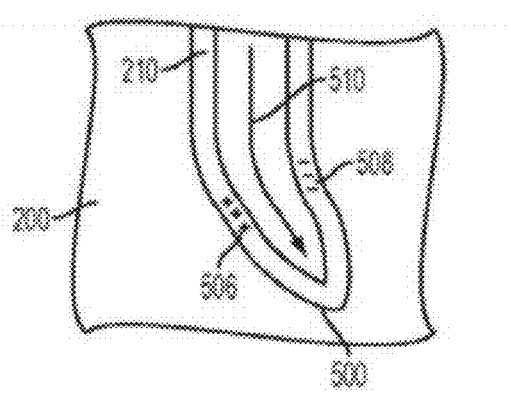
FIG. 5B shows a magnified view of the bottom region of etched contact hole of FIG. 5A, illustrating this accumulated charge in polymer layer.

In one example embodiment, during the periods where the low frequency sheath potential reaches a minimum in its oscillation and the high frequency is "off," the plasma sheath potential is very small and there is little potential barrier at the wafer surface. In this situation, electrons that were confined in the plasma may now escape to the wafer surface. This may effectively neutralize any positive charges that may have been built up while the sheath potential was large. This neutralization of charges thus helps to avoid the charging effect, which is one possible cause of contact hole distortion in conventional methods, for example as discussed above with reference to FIGS. 5A and 5B. This neutralization may be more efficient than in the conventional case, where the high frequency is not modulated. However, it should be noted that the signal provided by RF driver 110 that is based on a first signal and a second signal or a manner for generating a plasma sheath potential that is based on a first signal and a second signal, in accordance with the present invention, may be provided for other reasons.

In the conventional case, where both low and high frequency are continuously supplied, with no modulation, the effect of the high frequency has some benefits. The plasma has a higher density and provides higher ion flux and more polymerization, which is expected to result in faster etch rate and better contact-to-mask etch selectivity. However the continuous presence of the high frequency sheath component may prevent the complete collapse of the plasma sheath, and result in a lower limit for the ion energy distribution function of ions reaching the wafer (as illustrated in FIG. 3D as item 310), such that no appreciable flux of ions reach the wafer surface at very low energy. This may prevent beneficial effects of very low energy ions, as described below. Alternatively, considering the conventional case, where no high frequency driving function is used and only low frequency driving function is supplied, as mentioned previously, secondary electron emission is what primarily sustains the plasma. As the plasma sheath potential at the wafer decreases to a point below a certain a threshold, the plasma sheath begins to "collapse." As the plasma sheath potential approaches zero (LF minimum 610), ions reach the wafer surface at very low energies, and may be attracted to regions of negative charge buildup on the surfaces of the contact hole walls. This allows for charges in deposited polymer layers or pre-existing dielectric films to be neutralized, thereby avoiding the charging effect that gives rise to distortion of etched holes. This constitutes a benefit of the low frequency only regime. However the low frequency only regime typically suffers from relatively low ion flux and low polymerization, leading to relatively low etch rate and contact-to-mask selectivity. Thus, aspects in accordance with the present invention, when applied with a suitable combination of parameters, may combine the charge-neutralization benefits of the low frequency only case and the high etch rate, high contact-to-mask selectivity benefits of the high frequency case.

The plasma during "ON" period 606 has higher density and provides higher ion flux and more polymerization, which is expected to result in faster etch rate and better contact-to-mask etch selectivity. As shown in FIG. 6, during ON period 606, the amplitude of high frequency portion 604 is much smaller than that of low frequency portion 602. The signal provided by RF driver 110 that corresponds to high frequency portion 604 is chosen in such a way that the plasma sheath potential at the wafer has sufficient RF cycles during ON period 606 to provide enough time to transfer RF power to electrons in the plasma and to increase plasma density.

In summary, during ON period 606, high frequency portion 604 is ON and therefore the plasma exhibits higher plasma density and higher ion flux. Hence, during this period, the etch rate is faster. Also, due to the high plasma sheath potential, the ion bombardment energies are very high. Then, as OFF period 608 begins, the signal provided by RF driver 110 corresponds to high frequency portion 604 being turned off. Since now only low frequency portion 602 is present in the plasma sheath potential at the wafer, the ion flux is lower and the etch rate is slower. But the higher polymerization produced by the high frequency portion in the ON periods persists to some extent during the OFF period, resulting in better contact-to-mask etch selectivity.

As such, by enabling RF driver 110 to provide a signal that results in a plasma sheath potential that is based on a continuous low frequency portion 602 and a high frequency portion 604 in accordance with an aspect of the present invention, one can obtain fast etch rate and good selectivity (attributed to the effects of the ON period 606), while also reducing the feature charge-up which may cause distortion (attributed to the effects of the OFF period 608).

It should be noted that other mechanisms may exist to provide evidence of advantages of the signal provided by RF driver 110 that is based on a first signal and a second signal or a manner for generating a plasma sheath potential that is based on a first signal and a second signal, in accordance with the present invention. One non-limiting example mechanism is drawn to the plasma chemistry during OFF period 608 being different than the plasma chemistry during ON period 606 because the electron heating during OFF period 608 is much different than the electron heating during ON period 606. Accordingly, in accordance with an aspect of the present invention, the signal provided by RF driver 110 that is based on a first signal and a second signal or a manner for generating a plasma sheath potential that is based on a first signal and a second signal, may be used to obtain a plasma chemistry that is close to a low frequency (only) driving signal condition in conjunction with the high ion flux of a dual frequency driving signal condition.

In the example discussed above, with reference to FIG. 6, the duty cycle of high frequency portion 604 is less than one half. More specifically, ON period 506 is 135 ns, whereas OFF period 608 is approximately 340 ns, such that the duty cycle of high frequency portion 604 is approximately 28%. In other embodiments, the duty cycle of high frequency portion 604 may be equal to or greater than one half. A duty cycle may be chosen to obtain required etching parameters. For instance, an increased duty cycle may provide a faster etch rate. However, an increased duty cycle may additionally decrease the neutralization in the deposited polymer layers, thus promoting distortion. Therefore a chosen duty cycle may optimize etch rate and minimize distortion.

In the example discussed above with reference to FIG. 6, the plasma sheath potential as a function of time is a result of a specific type of RF driving signal provided to ESC 106 by RF driver 110. This type of RF driving signal will then be described in more detail below with reference to FIGS. 7A-7D.

Figure 7A:
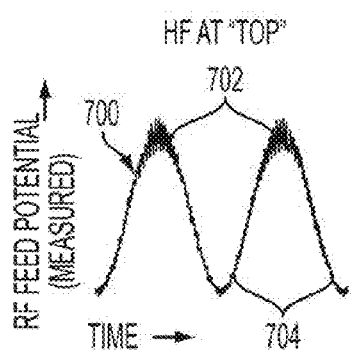
FIG. 7A is a graph representing a signals provided by an RF driver as a function of time.
Figure 7B:
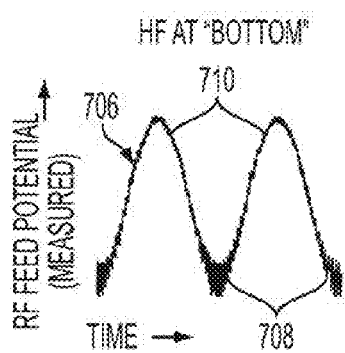
FIG. 7B is another graph representing a signals provided by an RF driver as a function of time in accordance with an aspect of the present invention.
Figure 7C:
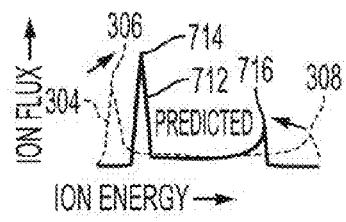
FIG. 7C is a graph representing ion flux as a function of ion energy, of the signal illustrated in FIG. 7A.
Figure 7D:
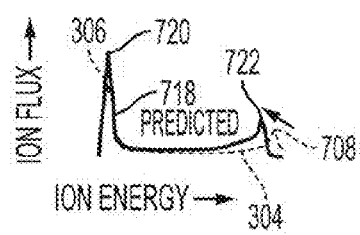
FIG. 7D is a graph representing ion flux as a function of ion energy, of the signal illustrated in FIG. 7B.

FIGS. 7A and 7B are graphs representing signals provided by RF driver 110 as a function of time. FIGS. 7C and 7D are each graphs representing predicted ion flux as a function of ion energy, of the signals illustrated in FIGS. 7A and 7B, respectively.

FIG. 7A includes a function 700, which is a driving signal including a low-frequency portion and a high frequency portion. The high frequency portion of function 700 includes an "ON" portion 702 and an "OFF" portion 704 that is amplitude-modulated at a frequency equal to a harmonic of the low-frequency portion such that ON portion 702 occurs at maximum potentials of the low-frequency portion whereas OFF portion 704 occurs at minimum potentials of the low-frequency portion.

FIG. 7B includes function 706, which is also a driving signal including a low-frequency portion and a high-frequency portion. The high-frequency portion of function 706 has an "ON" portion 708 and an "OFF" portion 710 that is amplitude-modulated at a frequency equal to a harmonic of the low-frequency portion such that ON portion 708 occurs at minimum potentials of the low-frequency portion whereas OFF portion 710 coincides with maximum potentials of the low-frequency portion.

FIG. 7C includes function 712, which illustrates predicted ion flux as a function of ion energy that results from using function 700 in FIG. 7A as the driving signal provided by RF driver 110. As shown in FIG. 7C, function 712 exhibits a first peak 714 for lower ion energies and a second peak 716 for higher ion energies. As illustrated in the figure, first peak 714 is much larger than second peak 716. Lower ion energies as represented by larger first peak 714 will have a specific effect on process results, whereas than higher ion energies represented by smaller second peak 716 will have a different effect on process results. In accordance with the present invention, process results may be more accurately controlled by controlling the amount of each effect through control of the driving signal provided by RF driver 110.

Figure 3A:
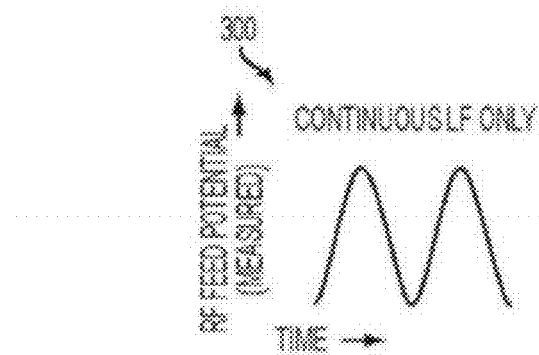
FIG. 3A is a graph representing a signals provided by an RF driver as a function of time.
Figure 3B:
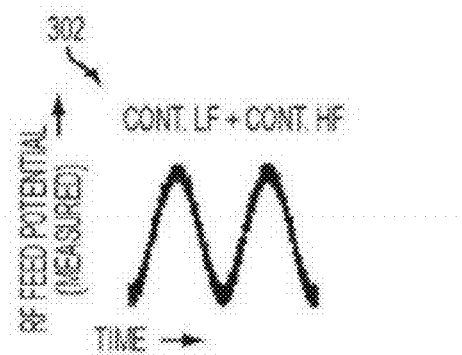
FIG. 3B is another graph representing a signals provided by an RF driver as a function of time.
Figure 3C:
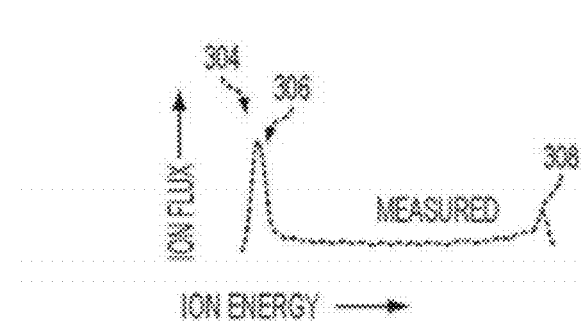
FIG. 3C is a graph representing ion flux as a function of ion energy, of the signal illustrated in FIG. 3A.
Figure 3D:
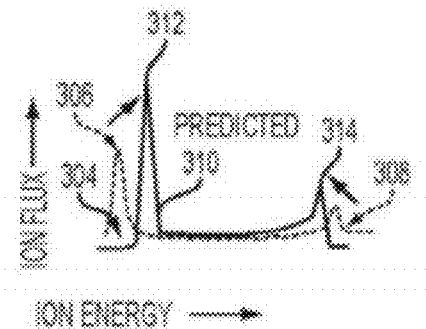
FIG. 3D is a graph representing ion flux as a function of ion energy, of the signal illustrated in FIG. 3B.

Function 304 of FIG. 3C (which corresponds to a low-frequency only driving signal) is shown in FIG. 7C as a dotted line for reference. In FIG. 7C, it is clear that first peak 714 is shifted to a higher ion energy from first peak 306 of function 304. Further, it is clear that second peak 716 is shifter to a lower ion energy from second peak 308 of function 304. Also, note that the amount of ion flux corresponding to ion energy of first peak 714 is greater than the amount of ion flux corresponding to ion energy of first peak 306. Therefore, it is clear that using function 700 as a driving signal will provide an overall increase in plasma density and ion flux as compared to using function 300 as a driving signal.

FIG. 7D includes function 718, which illustrates the predicted ion energy distribution that would result from implementing function 706 of FIG. 7B as the driving signal provided by RF driver 110. Function 304 is shown in FIG. 7D as a dotted line for reference.

As shown in the figure, function 718 contains a first peak 720 for lower ion energies and a second peak 722 for higher ion energies. Lower ion energies as represented by larger first peak 720 will have a specific effect on process results, whereas than higher ion energies represented by smaller second peak 722 will have a different effect on process results. In accordance with the present invention, process results may be more accurately controlled by controlling the amount of each effect through control of the driving signal provided by RF driver 110.

First peak 720 is not significantly shifted to a different ion energy from that of first peak 306 of function 304. Second peak 722 is shifted to a lower ion energy from that of second peak 308.

Similar to the situations discussed above with respect to FIGS. 3D and 7C, the amount of ion flux of first peak 720 is much greater than that of peak 306, indicating an increase in plasma density. However, as different from the situations discussed above with respect to FIGS. 3D and 7C, the ion flux of first peak 720 is not significantly shifted to a different ion energy from that of first peak 306 of function 304. As illustrated in function 706, a driving signal in accordance with an aspect of the present invention provides an overall increase in plasma density and ion flux, and concurrently maintains the presence of low-energy ions. This ion energy distribution cannot be achieved by combining continuous multi-frequency excitations, it is a unique result of the invention. This may be beneficial for HARC etch processes because the presence of low-energy ions may help reduce the charging effect by helping to discharge built-up charge in trench sidewalls, while the higher ion flux and more polymerizing chemistry introduced by the modulated high frequency signal will tend to improve etch rate and contact to mask selectivity.

Therefore, an example embodiment in accordance with an aspect of present invention is to implement an RF driving signal with the form of function 706 of FIG. 7B such that a plasma sheath potential with form of function 600 of FIG. 6 can be obtained. Note that due to the way the potentials are measured, the resulting plasma sheath potential associated with function 600 of FIG. 6 is of opposite polarity than the potential of driving signal associated with function 706 of FIG. 7B.

The embodiment discussed above with reference to FIG. 6 and FIG. 7, is additionally discussed with reference to the wafer processing system of FIG. 1. It should be noted however, that an aspect of the present invention is not limited to the wafer processing system of FIG. 1. On the contrary, an aspect of the present invention may be used with any wafer processing system that is operable to generate plasma via an applied electromagnetic field. This includes, but is not limited to, capacitively-coupled or inductively-coupled plasma processing systems. In this light, any known method of applying an electromagnetic field to generate plasma may be used in accordance with the present invention. In the example discussed above with reference to FIG. 1, a driving signal is applied to a single electrode. In other embodiments, a plurality of active electrodes may be disposed around a plasma forming space, which is arranged to receive a gas. In these embodiments, driving signals may be provided to the plurality of electrodes to generate an electromagnetic field within the plasma forming space to create plasma from the gas and obtain a plasma sheath potential in accordance with the present invention In the embodiment discussed above with reference to FIGS. 6 and 7D, the resulting plasma sheath potential (function 600) is based on two portions, i.e., continuous low frequency portion 602 and high frequency portion 604. It should be noted however, that other embodiments may include generation of plasma having a resulting plasma sheath potential that is based on more than two portions, e.g., a continuous low frequency portion and a plurality of non-continuous high frequency portions.

In the embodiment discussed above with reference to FIGS. 6 and 7, continuous low frequency portion 602 is amplitude-modulated at a frequency equal to a harmonic of high frequency portion 604, such that ON period 606 centered about the maximum amplitude intervals of low frequency portion 602. However, in other embodiments, continuous low frequency portion 602 may be amplitude-modulated at a frequency equal to a harmonic of high frequency portion 604, such that ON period 606 is disposed off-center from the maximum amplitude intervals of low frequency portion 602. The specific placement of ON period 606 with respect to the center of the maximum amplitude intervals of low frequency portion 602 will provide modified etching characteristics as desired.

A benefit of an aspect of the present invention will now be further described with reference to FIG. 8.

Figure 8:
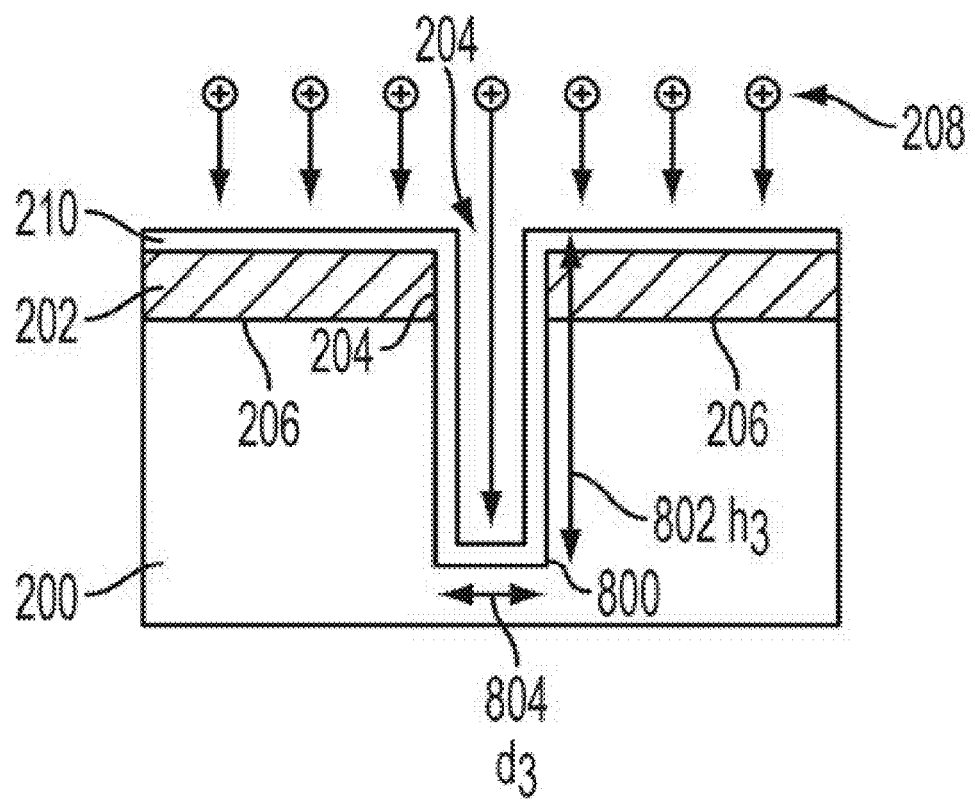
FIG. 8 illustrates the cross-section of a wafer after an exemplary HARC etch process in accordance with an aspect of the present invention.

FIG. 8 illustrates the cross-section of wafer 114 after an exemplary HARC etch process in accordance with an aspect of the present invention.

Figure 2A:
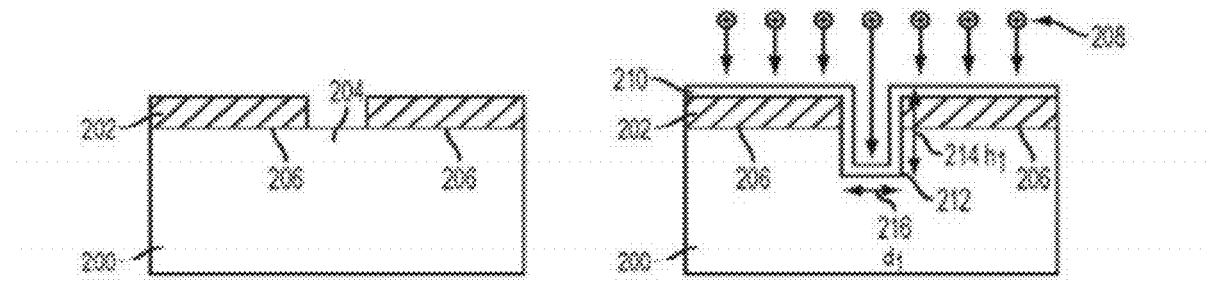
FIG. 2A illustrates a cross-section of a wafer as shown in FIG. 1, before plasma is formed and thus before any material on the wafer is etched.
Figure 2B:
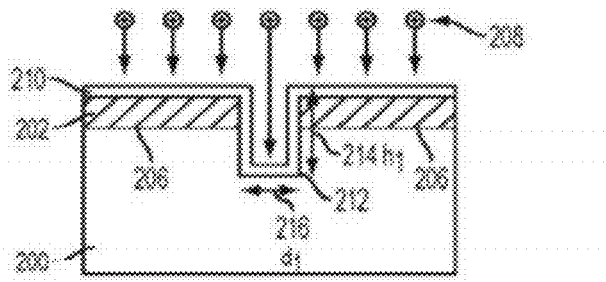
FIG. 2B illustrates a cross-section the wafer, after plasma has been formed and the etching process has begun.
Figure 4:
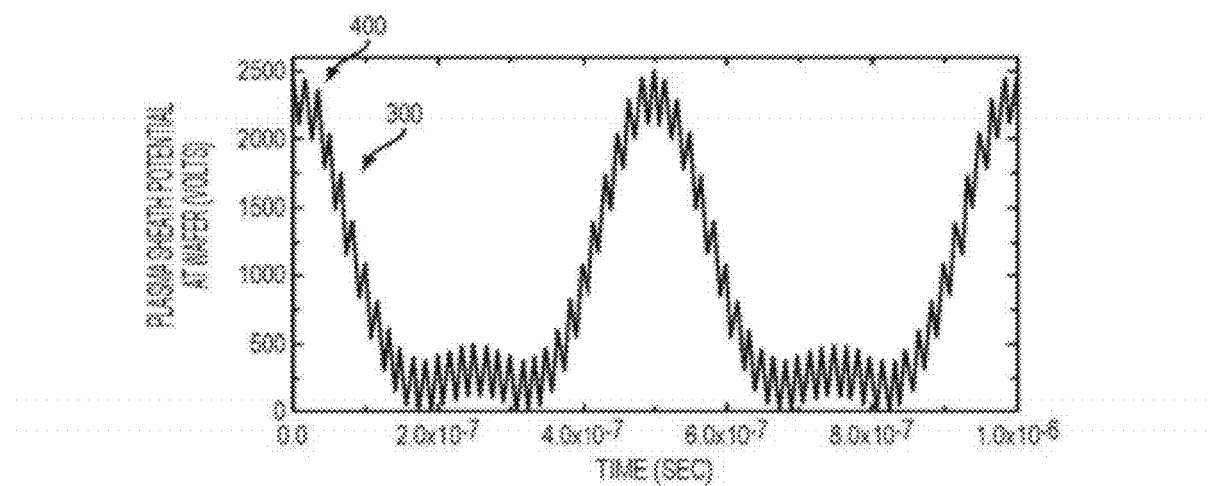
FIG. 4 is a graph illustrating a plasma sheath potential at a wafer in a conventional method for providing a HARC etch.

As illustrated in the figure, incident plasma ions 208 bombard the surface of wafer 114, etching portion of substrate 200 in unmasked area 204 and forming etched hole 800. At the same time, incident plasma ions 208 with incident flux of polymerizing neutral species form polymer layer 210. Etched hole 800 has hole height 802 (denoted as $h_3$) and hole diameter 804 (denoted as $d_3$). Therefore etched hole 800 has an aspect ratio of $h_3/d_3$. Here, as compared to the conventional method discussed above with reference to FIG. 2B, $h_3 \gg h_1$. Consequently, the aspect ratio of etched hole 800 is notably higher than the aspect ratio of etched hole 212 of FIG. 2B.

As shown in FIG. 8, ion trajectory 806 is completely vertical, and the sidewalls of etched hole 800 are straight, exhibiting no distortion or twisting. This is because during the OFF periods as illustrated in FIG. 6, charges in the polymer layer 210 are neutralized, thus preventing appreciable charges from accumulating in polymer layer 210. Since there is minimal charging effect, there is no electric field to deflect ion trajectory 806, allowing for etched hole 800 (high aspect ratio contact hole) to form with minimal distortion or twisting.

In accordance with an aspect of the present invention, an arrangement of RF waveforms is applied to the wafer processing system in order to provide for the best HARC etch results with no distortion and high etch rate and selectivity. The applied RF signal and therefore the plasma sheath potential at the wafer includes a continuous low frequency portion and a high frequency portion. The high frequency portion of the RF signal has a maximum amplitude only during the low voltage part of the low frequency cycle, and has a minimum amplitude (or is turned OFF) for all other times. Therefore, the resulting plasma sheath potential at the wafer includes a high frequency portion that has a maximum amplitude only during the high voltage part of the low frequency cycle (the ON period) and has a minimum amplitude at all other times (OFF period). Thus the plasma during the ON periods exhibits high plasma density, and high ion energy, while the plasma during the OFF periods behaves like pulsed DC discharge. The time-averaged effect of the ON period is to shift the plasma chemistry to be more polymerizing, thus contributing to good selectivity. In this manner, the ON periods provide for fast etch rate and good contact-to-mask selectivity, while the OFF periods provide a time to neutralize charge buildup in contact hole sidewalls, thereby reducing distortion.

As discussed above, in accordance with an aspect of the present invention, a processing system that is operable to generate a plasma by way affecting a gas with an electromagnetic field is operated in a particular manner. This particular manner controls a parameter as a function of time that is based on a low frequency sinusoidal portion and a high frequency sinusoidal portion. The high frequency sinusoidal portion is amplitude-modulated at a frequency equal to a harmonic of the low frequency sinusoidal portion.

In some embodiments, the particular manner the processing system is operated is drawn to adjusting the phase between the high frequency sinusoidal portion and the low frequency sinusoidal portion to adjust processing within the processing system. In some embodiments, the parameter is drawn to a plasma sheath potential, whereas in other embodiments, the parameter is drawn to a driving signal.

Further, in accordance with an aspect of the present invention, the high frequency sinusoidal portion includes a high amplitude interval and a low amplitude interval. In some embodiments, the particular manner the processing system is operated is drawn to adjusting at least one of the amplitude of the high amplitude interval and the amplitude of the low amplitude interval to adjust processing within the processing system. In some embodiments, the parameter is drawn to a plasma sheath potential, whereas in other embodiments, the parameter is drawn to a driving signal.

Further, in accordance with an aspect of the present invention, the duration of the duty cycle of the high frequency sinusoidal portion is the ratio of the duration of the high amplitude interval to the sum of the duration of the high amplitude interval and the duration of the low amplitude interval. In some embodiments, the particular manner the processing system is operated is drawn to adjusting the duration of the duty cycle of the high frequency sinusoidal portion to adjust processing within the processing system. In some embodiments, the parameter is drawn to a plasma sheath potential, whereas in other embodiments, the parameter is drawn to a driving signal.

As discussed above, an aspect of the present invention is drawn to the high-frequency sinusoidal portion of the plasma sheath potential as a function of time is amplitude-modulated at a frequency equal to a harmonic of the low frequency sinusoidal portion. In some of the examples discussed above, the high-frequency sinusoidal portion of the plasma sheath potential as a function of time is amplitude-modulated at a frequency equal to a first harmonic of the low frequency sinusoidal portion. In a particular example, the relative phase difference at the first harmonic provides maximum amplitude interval of the high-frequency sinusoidal portion at or near the maximum amplitude of a cycle of the low frequency sinusoidal portion and the minimum amplitude interval of the high frequency sinusoidal portion at or near the minimum amplitude of a cycle of the low frequency sinusoidal portion. In other examples, the high-frequency sinusoidal portion of the plasma sheath potential as a function of time is amplitude-modulated at a frequency equal to an $n^{th}$ harmonic, where n is an integer, of the low frequency sinusoidal portion. In such examples, n high frequency sinusoidal portions may occur at different portions of the low frequency sinusoidal portion.

As discussed above, an aspect of the present invention is drawn to the high-frequency sinusoidal portion of a driving signal as a function of time is amplitude-modulated at a frequency equal to a harmonic of the low frequency sinusoidal portion. In some of the examples discussed above, the high-frequency sinusoidal portion of the driving signal as a function of time is amplitude-modulated at a frequency equal to a first harmonic of the low frequency sinusoidal portion. In a particular example, the relative phase difference at the first harmonic provides maximum amplitude interval of the high-frequency sinusoidal portion at or near the minimum amplitude of a cycle of the low frequency sinusoidal portion and the maximum amplitude interval of the high frequency sinusoidal portion at or near the maximum amplitude of a cycle of the low frequency sinusoidal portion. In other examples, the high-frequency sinusoidal portion of the plasma sheath potential as a function of time is amplitude-modulated at a frequency equal to an $n^{th}$ harmonic, where n is an integer, of the low frequency sinusoidal portion. In such examples, n high frequency sinusoidal portions may occur at different portions of the low frequency sinusoidal portion.

The example embodiments discussed above are drawn to etching. It should be noted however, that aspects of the present invention are not limited to etching. On the contrary, aspects of the present invention may be used with any wafer processing system that is operable to generate plasma via an applied electromagnetic field for any process, non-limiting examples of which include deposition, implantation, autocleaning, etc.

By adjusting any one of: the amplitude of the high amplitude interval of the high frequency sinusoidal portion; the amplitude of the low amplitude interval of the high frequency sinusoidal portion; the duration of the duty cycle of the high frequency sinusoidal portion; the phase between the high frequency sinusoidal portion and the low frequency sinusoidal portion; and amplitude-modulation harmonic of the high-frequency sinusoidal portion processing characteristics of the processing system may be accurately controlled.

The foregoing description of various preferred embodiments of the invention have been presented for purposes of illustration and description. It is not intended to be exhaustive or to limit the invention to the precise forms disclosed, and obviously many modifications and variations are possible in light of the above teaching. The exemplary embodiments, as described above, were chosen and described in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed as new and desired to be protected by Letters Patent of the United States is:

1. A method of operating a plasma processing system having a space for receiving gas, an electrode portion and an RF driver, the RF driver being operable to provide a driving signal to the electrode portion, said method comprising:
   providing a gas into the space;
   providing the driving signal to the electrode portion, the driving signal being based on a first signal portion and a second signal portion; and
   generating, from the gas, a plasma in the space,
   wherein the plasma has a plasma sheath,
   wherein the plasma sheath has a plasma sheath potential,
   wherein the plasma sheath potential is based on the driving signal,
   wherein the plasma sheath potential as a function of time based on a first plasma sheath potential function portion and a second plasma sheath potential function portion,
   wherein the first plasma sheath potential function portion comprises a continuous sinusoidal portion having a first amplitude and a first frequency,
   wherein the second plasma sheath potential function portion comprises a sinusoidal portion having a maximum amplitude interval, and a minimum amplitude interval and a duty cycle,
   wherein the maximum amplitude interval has a second frequency, a first duration and a first interval amplitude,
   wherein the minimum amplitude interval has a second duration and a second interval amplitude,
   wherein the first interval amplitude is larger than the second interval amplitude,
   wherein the duty cycle is the ratio of the first duration to the sum of the first duration and the second duration, and
   wherein the second plasma sheath potential function portion is amplitude-modulated at a frequency equal to a harmonic of the first frequency.

2. The method of claim 1, wherein said providing the driving signal to the electrode comprises providing the driving signal to the electrode such that the first amplitude is more than the second amplitude.

3. The method of claim 2, wherein said providing the driving signal to the electrode comprises providing the driving signal to the electrode such that the first duration is less than or equal to the second duration.

4. The method of claim 3, wherein said providing the driving signal to the electrode comprises providing the driving signal to the electrode such that the maximum amplitude interval is coincident with a maximum plasma sheath potential.

5. The method of claim 2, wherein said providing the driving signal to the electrode comprises providing the driving signal to the electrode such that the maximum amplitude interval is coincident with a maximum plasma sheath potential.

6. The method of claim 1, wherein said providing the driving signal to the electrode comprises providing the driving signal to the electrode such that the first duration is less than or equal to the second duration.

7. The method of claim 6, wherein said providing the driving signal to the electrode comprises providing the driving signal to the electrode such that the maximum amplitude interval is coincident with a maximum plasma sheath potential.

8. The method of claim 1, wherein said providing the driving signal to the electrode comprises providing the driving signal to the electrode such that the maximum amplitude interval is coincident with a maximum plasma sheath potential.

9. The method of claim 1, wherein the harmonic is 1.

10. The method of claim 1, wherein the harmonic is greater than 1.

11. A method of operating a plasma processing system having a space therein arranged to receive a gas and an electromagnetic field generating portion operable to generate an electromagnetic field within the space, said method comprising:

providing a gas into the space; and operating the electromagnetic field generating portion with a driving potential to generate an electromagnetic field within the space to transform at least a portion of the gas into plasma, wherein the driving potential as a function of time is based on a first potential function portion and a second potential function portion, wherein the first potential function portion comprises a first continuous sinusoidal portion having a first amplitude and a first frequency, wherein the second potential function portion comprises a second sinusoidal portion having a maximum amplitude interval, a minimum amplitude interval and a duty cycle, wherein the second sinusoidal portion has a higher amplitude during the maximum amplitude interval than during the minimum amplitude interval, wherein the duty cycle is the ratio of the maximum amplitude interval to the sum of the maximum amplitude interval and the minimum amplitude interval, wherein the second sinusoidal portion additionally has a second frequency, wherein the second sinusoidal portion is amplitude-modulated at a frequency equal to a harmonic of the first frequency.

12. The method of claim 11, wherein said providing the driving signal to the electrode comprises providing the driving signal to the electrode such that the first amplitude is more than the second amplitude.

13. The method of claim 12, wherein said providing the driving signal to the electrode comprises providing the driving signal to the electrode such that the first duration is less than or equal to the second duration.

14. The method of claim 13, wherein said providing the driving signal to the electrode comprises providing the driving signal to the electrode such that the maximum amplitude interval is coincident with a maximum plasma sheath potential.

15. The method of claim 12, wherein said providing the driving signal to the electrode comprises providing the driving signal to the electrode such that the maximum amplitude interval is coincident with a maximum plasma sheath potential.

16. The method of claim 11, wherein said providing the driving signal to the electrode comprises providing the driving signal to the electrode such that the first duration is less than or equal to the second duration.

17. The method of claim 16, wherein said providing the driving signal to the electrode comprises providing the driving signal to the electrode such that the maximum amplitude interval is coincident with a maximum plasma sheath potential.

18. The method of claim 11, wherein said providing the driving signal to the electrode comprises providing the driving signal to the electrode such that the maximum amplitude interval is coincident with a maximum plasma sheath potential.

19. The method of claim 11, wherein the harmonic is 1.

20. The method of claim 11, wherein the harmonic is greater than 1.

* * * * *